(12) United States Patent
Kamiya

(10) Patent No.: US 6,320,475 B1
(45) Date of Patent: *Nov. 20, 2001

(54) PRINTED CIRCUIT BOARD SUPPRESSING RINGING IN SIGNAL WAVEFORMS

(75) Inventor: Hiroshi Kamiya, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/372,051

(22) Filed: Aug. 11, 1999

(30) Foreign Application Priority Data

Aug. 13, 1998 (JP) .................................. 10-229138

(51) Int. Cl.$^7$ ..................................................... H03H 11/00
(52) U.S. Cl. ........................... 333/103; 333/24 R; 333/20
(58) Field of Search ..................................... 333/101, 262, 333/24 R, 102–108, 20, 164

(56) References Cited

U.S. PATENT DOCUMENTS 5,136,265 * 8/1992 Pritchett ............................ 333/164 X
5,424,696 * 6/1995 Nakahara et al. ................. 333/164 X

FOREIGN PATENT DOCUMENTS

| 1-112061 | 7/1989 | (JP) . |
| 2-23002 | 6/1990 | (JP) . |
| 4-97562 | 3/1992 | (JP) . |
| 6-152355 | 5/1994 | (JP) . |
| 6-177612 | 6/1994 | (JP) . |

* cited by examiner

Primary Examiner—Justin P. Bettendorf
Assistant Examiner—Stephen E. Jones
(74) Attorney, Agent, or Firm—Sughrue, Mion, Zinn, Macpeak & Seas, PLLC

(57) ABSTRACT

The present invention relates to a printed circuit board of the present invention comprising: a main transmission line; and additional transmission lines positioned on both sides of the main transmission line and parallel-connected to the main transmission line by way of selectors.

12 Claims, 3 Drawing Sheets

PRINTED CIRCUIT BOARD SUPPRESSING RINGING IN SIGNAL WAVEFORMS

BACKGROUND OF THE INVENTION

1. Field of the Invention

This invention relates to a printed circuit board and an electronic device for connections between circuits in a personal computer and office automation devices.

This application is based on Japanese Patent Application No. 10-229138, the contents of which are incorporated herein by reference.

2. Background Art Including Information Disclosed Under37 CFR 1.97 and 1.98

In general, office automation devices such as personal computers and workstations include a number of printed circuit boards. As demand for acceleration of data processing and reduction in size has recently increased, the clock frequencies in the circuits have increased to more than several 100 MHz.

As the clock frequencies increased, however, unnecessary radiant noise may occur in the circuits on the printed circuit board. Because of the increase of the clock frequencies, the differences in length between connection lines may change the inductance. As the result, input signals show waveforms which include ringing, as shown in FIG. 3 (with the overshoot to 9V and the undershoot to −7V), which leads to the occurrence of unnecessary radiant noise. Further, when the terminating resistances change due to the irregularity of manufactured transmission lines, the characteristics of the impedance may be unbalanced, ringing may occur in the waveforms, and reflection of signals may occur, causing a malfunction or destruction of the semiconductor device.

Japanese Unexamined Patent Application, First Publication No. Hei 4-97562 discloses a technique for adjusting terminating resistances to suppress ringing in waveforms by selecting one of a number of terminating resistances. Japanese Unexamined Patent Application, First Publication No. Hei 6-152355 discloses a technique to suppress the ringing by a dummy line whose one end is open or connected to the ground. Japanese Unexamined Patent Application, First Publication No. Hei 6-177612 discloses a technique to manufacture a printed circuit board of a material which can suppress the ringing.

SUMMARY OF THE INVENTION

It is therefore an object of the present invention to provide a printed circuit board and an electronic device which suppress ringing and securely prevents the malfunction and destruction of the device.

The printed circuit board of the present invention comprises: a main transmission line; and additional transmission lines positioned on both sides of the main transmission line and parallel-connected to the main transmission line by way of selectors.

The selectors may be semiconductor switches. A plurality of pairs of an additional transmission line and a selector may be provided.

The printed circuit board comprises: a first transmission line; second and third transmission lines positioned on both sides of the first transmission line and parallel-connected to the first transmission line; and first to fourth selectors, each selector having first and second terminals, the each selector being able to connect and disconnect the first terminal to the second terminal. One end of the first transmission line is connected to the first terminal of the first selector and to the first terminal of the second selector. The second terminal of the first selector is connected to one end of the second transmission line. The second terminal of the second selector is connected to one end of the third transmission line. The other end of the second transmission line is connected to the first terminal of the third selector. The other end of the third transmission line is connected to the first terminal of the fourth selector. The other end of the first transmission line is connected to the second terminal of the third selector and to the second terminal of the fourth selector.

DETAILED DESCRIPTION OF THE PREFERRED EMBODIMENTS

Figure 1:
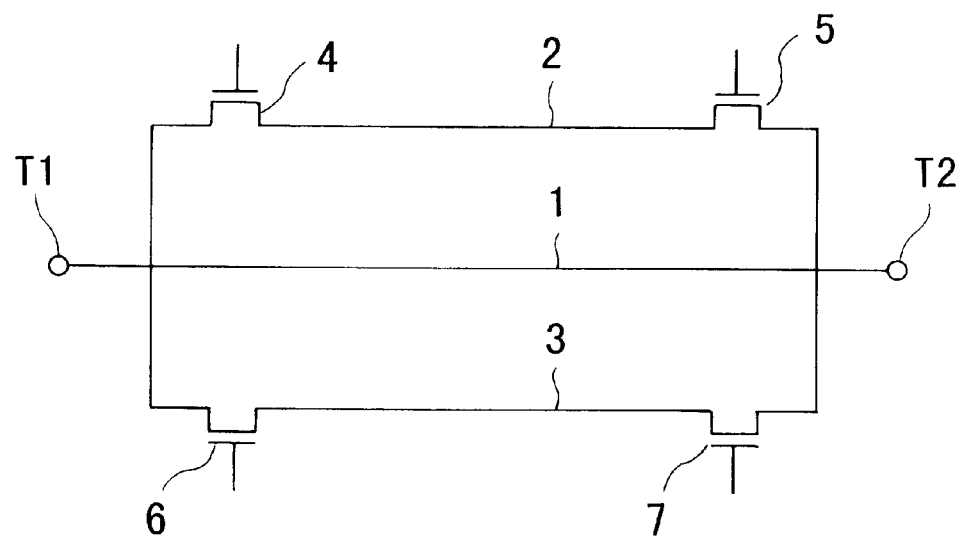
FIG. 1 is a diagram showing the circuit on the printed circuit board according to the present invention.
Figure 2:
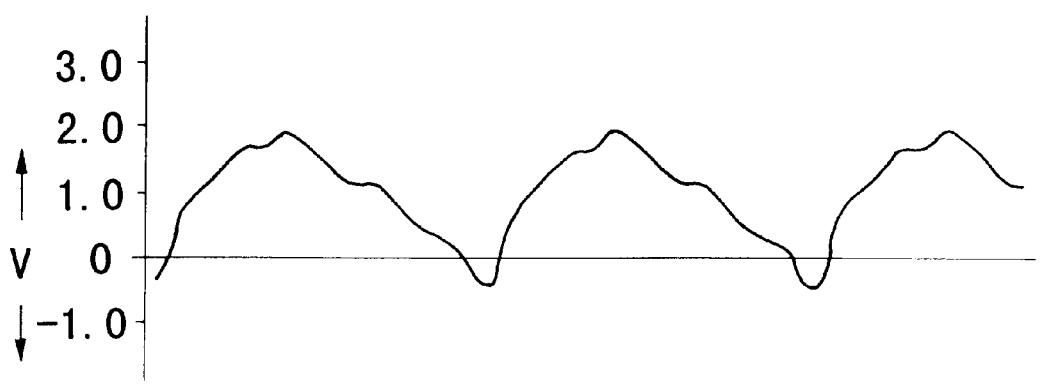
FIG. 2 is a diagram showing the waveforms suppressing ringing according to the present invention.

The best mode of the printed circuit board according to the present invention will be explained. FIG. 1 shows a plurality of transmission lines provided on the printed circuit board in the electronic device of the present invention. Reference numeral 1 denotes a first transmission line with a specified impedance. Reference numerals 2 and 3 denote second and third transmission lines (additional transmission lines), which are positioned on both sides of the first transmission line to suppress ringing of an input waveform signal, and which are selectively parallel-connected. To switch the parallel-connection and disconnection, the second transmission line 2 has a first selector circuit 4 and a third selector circuit 5, and the third transmission line 3 has a second selector circuit 6 and a fourth selector circuit 7. These selector circuits 4 to 7 may be semiconductor switches on the printed circuit board.

The connections between the transmission lines 1 to 3 will be explained in detail. One end terminal T1 of the first transmission line 1 is connected to a first terminal of the first selector circuit 4 and to a first terminal of the second selector circuit 6. A second terminal of the first selector circuit 4 is connected to one end terminal of the second transmission line 2. A second terminal of the second selector circuit 6 is connected to one end terminal of the third transmission line 3. The other end terminal of the second transmission line 2 is connected to a first terminal of the third selector circuit 5. The other end terminal of the third transmission line 3 is connected to a first terminal of the fourth selector circuit 7. The other end terminal T2 of the first transmission line 1 is connected to the other terminal of the third selector circuit 5 and to the other terminal of the fourth selector circuit 7.

Figure 3:
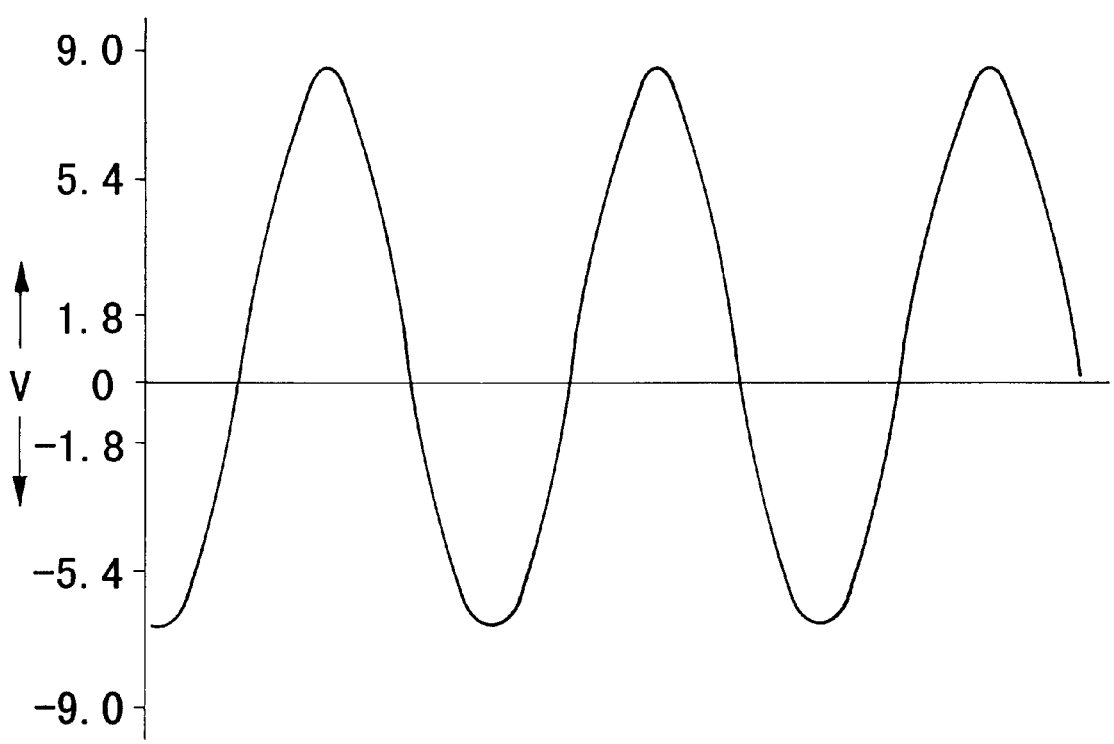
FIG. 3 is a diagram showing the waveforms of an output signal from the conventional printed circuit board.

The operation of the embodiment will be explained. In response to a selection signal input to the first selector circuit 4, the first selector circuit 4 is turned off. In response to a selection signal input to the second selector circuit 6, the second selector circuit 6 is turned off. In response to a selection signal input to the third selector circuit 5, the third selector circuit 5 is turned off. In response to a selection signal input to the fourth selector circuit 7, the fourth selector circuit 7 is turned off. Then, when the impedance of the first transmission line 1 is 75Ω, waveforms at the other terminal T2 of the first transmission line 1 show the overshoot to 9V and the undershoot to −7V as shown in FIG. 3, because the second and third transmission lines 2 and 3 are disconnected from the first transmission line 1.

On the other hand, in response to the selection signal input to the first selector circuit 4, the first selector circuit 4 is turned on. In response to the selection signal input to the second selector circuit 6, the second selector circuit 6 is turned on. In response to the selection signal input to the third selector circuit 5, the third selector circuit 5 is turned on. In response to the selection signal input to the fourth selector circuit 7, the fourth selector circuit 7 is turned on. In this situation, waveforms at the other terminal T2 of the first transmission line 1 suppress the undershoot and the overshoot and are appropriately shaped, because the second and third transmission lines 2 and 3 are parallel-connected to the first transmission line 1.

Because the second and third transmission lines are located on both sides of and are parallel-connected to the first transmission line, the present invention suppresses ringing in the input signal voltage waveforms without changing the length of the first transmission line. As the result, the electrical signal can be stably transmitted, and functions of a high speed chip module are reliable. A plurality of pairs of the additional transmission line and the selector may be provided.

Figure 4:
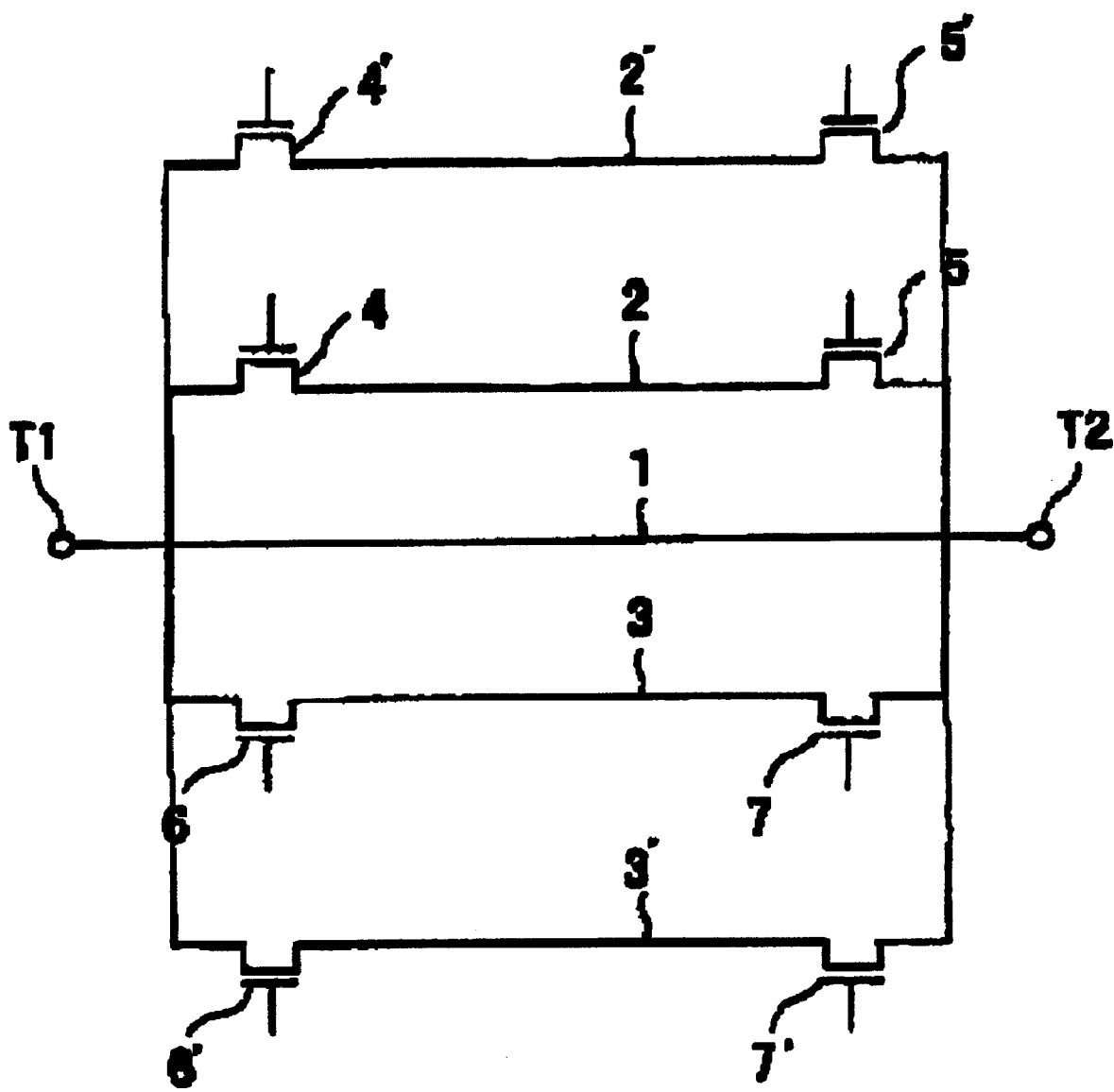
FIG. 4 is a diagram showing the circuit on the printed circuit board according to another embodiment of the present invention.

Referring to FIG. 4, transmission lines 2' and 3' are connected to the transmission line 1. Selector circuits 4', 5', 6', and 7' the same elements as the selector circuits 4, 5, 6, and 7, respectively.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A printed circuit board comprising:
   a main transmission line; and
   additional transmission lines, positioned on both sides of said main transmission line and parallel-connected to said main transmission line by way of selectors, to suppress ringing of an input waveform signal.

2. A printed circuit board according to claim 1, wherein said selectors are semiconductor switches.

3. A printed circuit board according to claim 2, wherein said additional transmission lines comprise a plurality of pairs of transmission lines, each line of each of said pairs of transmission lines being connected to said main transmission line by way of separate selectors.

4. A printed circuit board according to claim 1, wherein the on status of all of said selectors is the same.

5. An electronic device comprising:
   a main transmission line; and
   additional transmission lines, positioned on both sides of said main transmission line and parallel-connected to said main transmission line by way of selectors, to suppress ringing of an input waveform signal.

6. An electronic device according to claim 5, wherein said selectors are semiconductor switches.

7. An electronic device according to claim 6, wherein said additional transmission lines comprise a plurality of pairs of transmission lines, each line of each of said pairs of transmission lines being connected to said main transmission line with separate selectors.

8. A printed circuit board according to claim 5, wherein the on status of all of said selectors is the same.

9. A printed circuit board comprising:
   a first transmission line;
   second and third transmission lines, positioned on both sides of said first transmission line and parallel-connected to said first transmission line, to suppress ringing of an input waveform signal; and
   first to fourth selectors, each selector having first and second terminals, said each selector being able to connect and disconnect said first terminal to said second terminal, wherein
   one end of the first transmission line is connected to said first terminal of said first selector and to said first terminal of said second selector,
   said second terminal of said first selector is connected to one end of the second transmission line,
   said second terminal of said second selector is connected to one end of the third transmission line,
   the other end of said second transmission line is connected to said first terminal of said third selector,
   the other end of the third transmission line is connected to said first terminal of said fourth selector, and
   the other end of said first transmission line is connected to said second terminal of said third selector and to said second terminal of said fourth selector.

10. A printed circuit board according to claim 9, wherein the on status of all of said selectors is the same.

11. An electronic device comprising:
    a first transmission line;
    second and third transmission lines, positioned on both sides of said first transmission line and parallel-connected to said first transmission line, to suppress ringing of an input waveform signal; and
    first to fourth selectors, each selector having first and second terminals, said each selector being able to connect and disconnect said first terminal to said second terminal, wherein
    one end of the first transmission line is connected to said first terminal of said first selector and to said first terminal of said second selector,
    said second terminal of said first selector is connected to one end of the second transmission line,
    said second terminal of said second selector is connected to one end of the third transmission line,
    the other end of said second transmission line is connected to said first terminal of said third selector,
    the other end of the third transmission line is connected to said first terminal of said fourth selector, and
    the other end of said first transmission line is connected to said second terminal of said third selector and to said second terminal of said fourth selector.

12. A printed circuit board according to claim 11, wherein the on status of all of said selectors is the same.

* * * * *